United States Patent [19]

Lee

[11] 4,438,388

[45] Mar. 20, 1984

[54] SINGLE STAGE OPERATIONAL AMPLIFIER VOLTAGE REFERENCE

[75] Inventor: Robert D. Lee, Denton, Tex.

[73] Assignee: Motorola, Inc., Schaumburg, Ill.

[21] Appl. No.: 329,838

[22] Filed: Dec. 11, 1981

[51] Int. Cl.³ .............................................. G05F 3/20
[52] U.S. Cl. ..................................... 323/313; 307/297
[58] Field of Search .......................... 307/296 R, 297; 323/313, 314

[56] References Cited

U.S. PATENT DOCUMENTS

| | | | |
|---|---|---|---|
| 4,011,471 | 3/1977 | Rockett | 323/313 |
| 4,112,439 | 9/1978 | Kawasaki et al. | 323/313 |
| 4,264,874 | 4/1981 | Young | 307/297 |
| 4,287,438 | 9/1981 | Cave et al. | 323/315 |
| 4,330,744 | 5/1982 | Embree et al. | 307/297 X |

FOREIGN PATENT DOCUMENTS 54-132753 10/1979 Japan .................................. 323/313

Primary Examiner—A. D. Pellinen
Attorney, Agent, or Firm—Anthony J. Sarli, Jr.; Jeffrey Van Myers; Robert L. King

[57] ABSTRACT

A single stage operational amplifier voltage reference circuit for providing a precise reference voltage to bias multiple transistor-transistor logic (TTL) interface circuits is described. The voltage reference utilizes a current mirror having ratioed transistors to source or sink whatever current is necessary to maintain the reference voltage. The reference voltage is made substantially insensitive to process variations by ratioing transistor device sizes in a current source portion to transistor device sizes in an output load voltage divider portion. A capacitor is utilized to reduce transient errors at the output.

11 Claims, 2 Drawing Figures

SINGLE STAGE OPERATIONAL AMPLIFIER VOLTAGE REFERENCE

TECHNICAL FIELD

This invention relates generally to voltage reference circuits and, more particularly, to a single stage operational amplifier voltage reference which sources or sinks current to provide a substantially constant predetermined voltage.

BACKGROUND ART

Generally, reference voltages having a precise and stable predetermined value are required to bias transistor circuits such as transistor-transistor logic (TTL) interface circuits. Voltage reference circuits are therefore used to source or sink an amount of output current needed to maintain a specific reference voltage at an output terminal. Typically, voltage references for TTL input circuits have two stages. The first stage is usually a differential amplifier stage and the second stage is usually a common source transistor gain stage having its output connected to an input of the differential amplifier to form a feedback loop. However, the second stage adds a frequency pole to the circuit which is in addition to the frequency pole of the differential amplifier. As a result, a frequency compensating capacitor is required to provide stability.

SUMMARY OF THE INVENTION

Accordingly, an object of the present invention is to provide an improved operational amplifier voltage reference for providing a selected output current at a predetermined output voltage.

Another object of this invention is to provide an improved operational amplifier voltage reference having a single stage and which is capable of sourcing or sinking a selected output current necessary to maintain a precise predetermined output voltage.

Yet another object of the invention is to provide an improved operational amplifier voltage reference having a single stage which provides a precise output voltage at a selected output current and which tracks process variations and compensates therefor.

In carrying out the above and other objects and advantages of the present invention, there is provided, in one form, an operational amplifier which is operating as a differential amplifier having a first and a second input and an output for providing a reference voltage. The first input is coupled to a bias voltage and the second input is coupled to the output. A current source provides a predetermined current to the differential amplifier. The current source comprises a first transistor which has a current electrode coupled to the differential amplifier. A second and a third transistor are coupled in series and provide a bias voltage to the control electrode of the first transistor. A plurality of TTL interface circuits is coupled to the reference voltage at the output. The differential amplifier either sources or sinks current at the output depending upon the conductivity of devices used. Further, when output loads other than TTL interface circuits are connected to the reference voltage, the voltage reference is capable of sourcing or sinking whatever output current is necessary to maintain the output voltage at the predetermined value.

The above and other objects, features and advantages of the present invention will be more clearly understood from the following detailed description taken in conjunction with the accompanying drawings.

DETAILED DESCRIPTION OF THE PREFERRED EMBODIMENT

Figure 1:
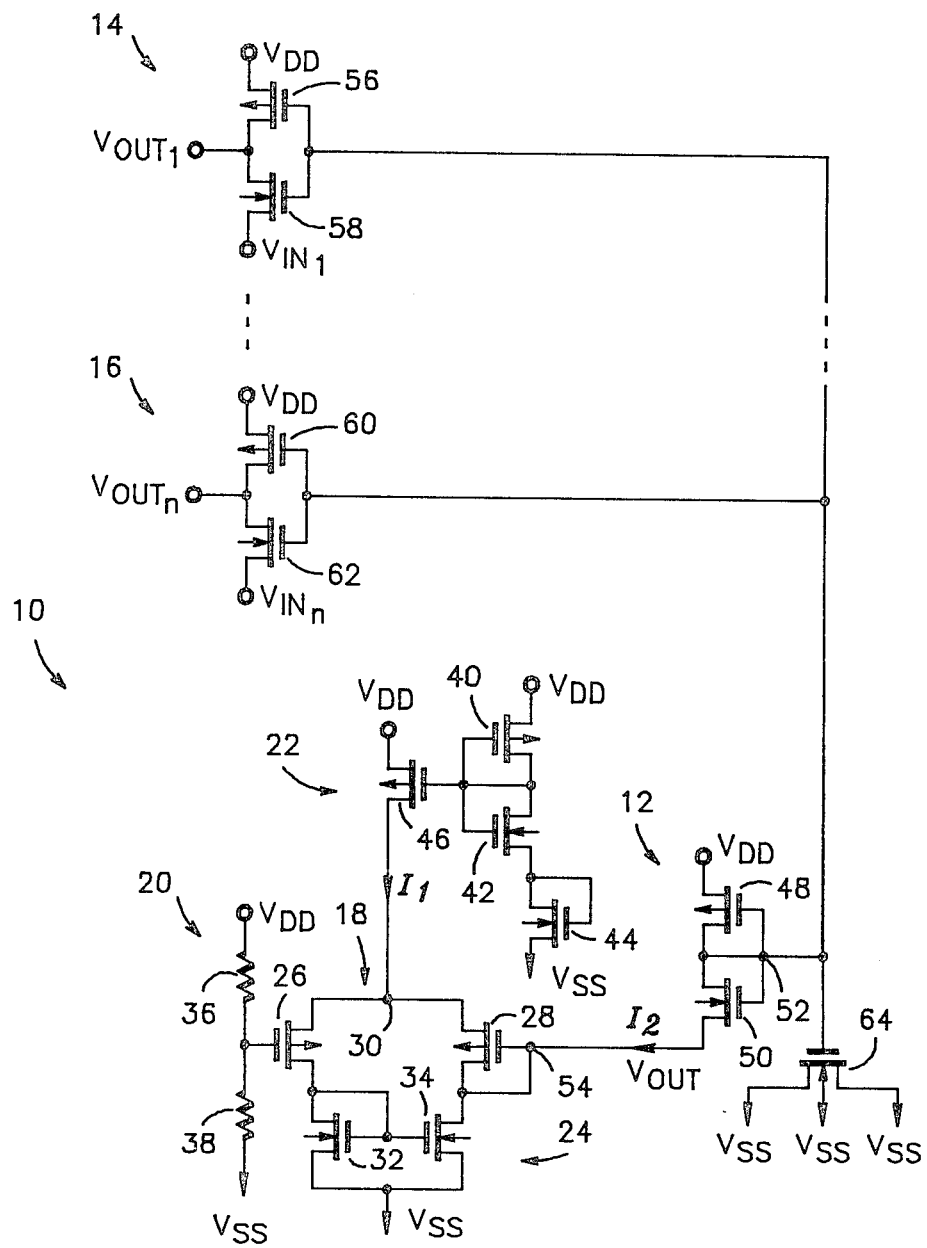
FIG. 1 illustrates in schematic form a single stage voltage reference constructed in accordance with the preferred embodiment of the present invention.

Shown in FIG. 1 is a single stage voltage reference 10 constructed in accordance with the preferred embodiment of the present invention. Coupled to the output via an output load voltage divider 12 are TTL interface circuits 14 and 16 which may also have other identical TTL circuits added in parallel. The voltage reference 10 is comprised generally of a differential pair 18, a voltage bias portion 20, a constant current source portion 22 and a current mirror portion 24. While specific N-channel and P-channel MOS devices are shown, it should be clear that voltage source 10 could be implemented by completely reversing the processing techniques (e.g., P-channel to N-channel) or by using other types of transistors.

The differential pair 18 is comprised of P-channel MOS transistors 26 and 28, each having first and second current electrodes and a control electrode. The first current electrodes and transistors 26 and 28 are coupled together to current source 22 at node 30. The input of differential pair 18 is at the control electrode of transistor 26 and the output is at the second current electrode of transistor 28. Transistor 28 has the second current electrode and control electrode thereof connected to place differential pair 18 in a unity gain voltage follower configuration.

In the current mirror portion 24, an N-channel MOS transistor 32 has a first current electrode connected to the second current electrode of transistor 26. Transistor 32 also has a control electrode connected to its first current electrode. An N-channel MOS transistor 34 has a first current electrode coupled to both the second current and control electrodes of transistor 28. Transistor 34 has a control electrode connected to both the control and first current electrodes of transistor 32. Transistors 32 and 34 have the second current electrodes thereof connected together to a first supply voltage, $V_{SS}$, which functions as a digital ground reference.

In the voltage bias portion 20, resistors 36 and 38 are connected in series and provide a voltage reference for differential pair 18. It will be understood that other components could serve as a voltage reference. Resistor 36 has a first terminal connected to a second supply $V_{DD}$ and a second terminal connected to the control electrode of transistor 26. Resistor 38 has a first terminal connected to both the second terminal of resistor 36 and the control electrode of transistor 26. A second terminal of resistor 38 is connected to supply voltage $V_{SS}$.

In the current source portion 22, MOS transistors 40, 42 and 44 are coupled in series. A P-channel MOS transistor 40 has a first current electrode connected to supply voltage $V_{DD}$ and a control electrode connected to a second current electrode thereof. An N-channel MOS transistor 42 has a first current electrode connected to the control electrode thereof and the second and control electrodes of transistor 40. An N-channel MOS transistor 44 has the first current electrode and the control electrode thereof coupled together and to the second current electrode of transistor 42. A second current electrode of transistor 44 is connected to supply voltage $V_{SS}$. A P-channel MOS transistor 46 is biased by connecting the control electrode thereof to the control electrodes of transistors 40 and 42 and to the second and first current electrodes of transistors 40 and 42, respectively. A first current electrode of transistor 46 is connected to supply voltage $V_{DD}$ and the second current electrode thereof is connected to differential pair 18 at node 30.

In the output load voltage divider portion 12 which is coupled to the output of voltage reference circuit 10, a P-channel MOS transistor 48 is connected in series with an N-channel MOS transistor 50. A first current electrode of transistor 48 is connected to supply voltage $V_{DD}$ and both a second current electrode and a control electrode of transistor 48 are connected to a first current electrode and a control electrode of transistor 50 at a common node 52. A second current electrode of transistor 50 is connected to the output of differential pair 18 at a node 54.

Coupled to the output load voltage divider portion 12 is a plurality of n identical TTL interface circuits, two of which are shown as circuits 14 and 16 comprising transistors 56, 58 and 60, 62, respectively. In circuit 14, a P-channel MOS transistor 56 has a first current electrode coupled to supply voltage $V_{DD}$ and a control electrode coupled to node 52. An N-channel MOS transistor 58 has a first current electrode coupled to a second current electrode of transistor 56 to form an output $V_{OUT1}$ for circuit 14. A control electrode of transistor 58 is coupled to both the control electrode of transistor 56 and the output of the divider portion 12 at node 52. A second current electrode of transistor 58 is coupled to an input signal $V_{IN1}$.

In circuit 16, a P-channel MOS transistor 60 has a first current electrode coupled to supply voltage $V_{DD}$ and a control electrode coupled to node 52. An N-channel MOS transistor 62 has a first current electrode coupled to a second current electrode of transistor 60 to form an output $V_{OUTn}$ for circuit 16. A control electrode of transistor 62 is coupled to both the control electrode of transistor 60 and the output of the divider portion 12 at node 52. A second current electrode of transistor 58 is coupled to an input signal $V_{INn}$.

An N-channel MOS transistor 64 has a first and a second current electrode coupled to supply voltage $V_{SS}$ and a control electrode coupled to node 52. In this configuration, transistor 64 functions as a capacitor as explained below.

In operation, a predetermined value of the output voltage is chosen and resistors 36 and 38 are ratioed as a voltage divider so that the predetermined value is present across resistor 38 and at the control electrode of transistor 26. Current source portion 22 provides a current $I_1$ to node 30 which is constant and made to be substantially equal to the output current, $I_2$. Current $I_1$ is divided at node 30 equally between transistors 26 and 28 when differential pair 18 is balanced. In current mirror portion 24, the current flowing through transistor 34 is proportional to and determined by the current flowing through transistor 32. Therefore, transistor 32 functions as an input and transistor 34 functions as an output. However, the current flowing through transistors 32 and 34 does not have to be equal for balanced operation of differential pair 18 if the device size ratios are not equal and $I_2$ is not zero.

In choosing circuit parameters for voltage reference 10, three parameters which are of primary importance are $V_{OUT}$, $I_1$ and $I_2$. Assume, for the purpose of illustration only, that $V_{OUT}$ is chosen to be 1.4 volt since this is a common switchpoint voltage for TTL interface circuits. Also assume initially that $I_1$ equals $I_2$. Since transistor 28 is a P-channel device, $I_2$ is flowing into node 54 and through transistor 34 to $V_{SS}$. Therefore, the current flowing through transistor 34 is three times the amount flowing through transistor 32. To provide a balanced differential pair 18, the control electrode dimensions (i.e. device size) of transistor 34 are made three times as great as the control electrode dimensions of transistor 32. If $I_2$ does not equal $I_1$, then the size of transistor 34 can be ratioed with the size of transistor 32 at another multiple of the current flowing through transistor 32 in order to provide balanced differential amplifier operation. Also important to realize is that voltage reference 10 can be designed by initially establishing a device size ratio for transistors 32 and 34 and then making current source portion 22 generate the correct $I_1$ current to provide balanced differential amplifier operation.

Figure 2:
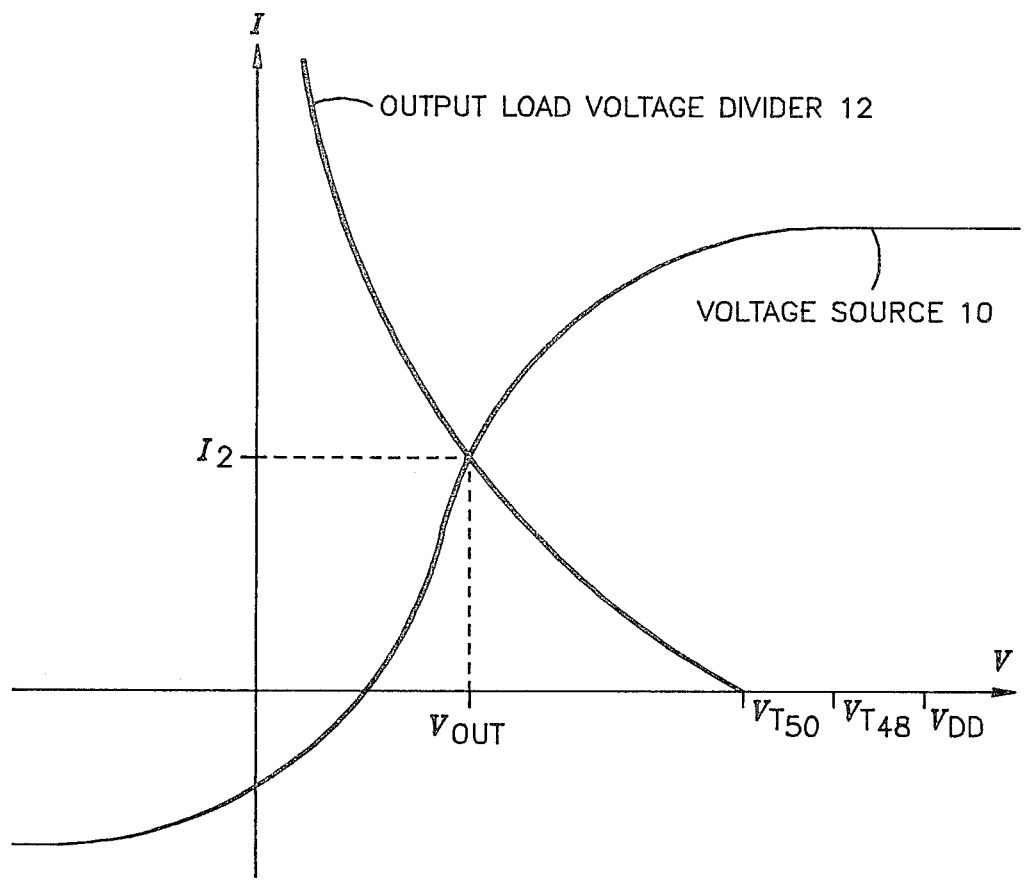
FIG. 2 illustrates in graphical form a transfer characteristic of the circuit of FIG. 1 when connected to an output load voltage divider.

Shown in FIG. 2 is a transfer characteristic curve for voltage reference 10 and output load voltage divider 12 which more clearly shows the relationship between currents $I_1$ and $I_2$. Output load voltage divider 12 provides a precise bias voltage to the control electrodes of the transistors of TTL interface circuits 14 and 16. In the embodiment shown, TTL interface circuits 14 and 16 function to switch input voltages $V_{IN1}$-$V_{INn}$ to a plurality of circuits (not shown). Interface circuits 14 and 16 are logic circuits which provide a high level output voltage when the input voltage $V_{IN}$ is equal to or greater than 1.4 volt and a low level output voltage otherwise. Therefore, output load voltage divider 12 must be substantially identical in structure to the TTL interface circuits 14 and 16 and the ratio of the device sizes of each P-channel transistor to N-channel transistor must be identical to the device size ratio of transistors 48 and 50 if the TTL interface circuits 14 and 16 switch at the predetermined output voltage of voltage reference 10. As shown in FIG. 2, output load voltage divider 12 does not begin to conduct a current $I_2$ until the bias voltage at node 52 is at least the threshold voltages, $V_T$, of transistors 48 and 50 below supply voltage $V_{DD}$. Current $I_2$ is determined by the intersection of the transfer characteristic of single stage voltage reference 10 with the transfer curve of output load voltage divider 12.

The ratio of device sizes of transistors 40 and 42, and 48 and 50 is also important in assuring proper circuit operation. As previously noted, transistors 48 and 50 are made as proportional as possible to transistors 56, 58 and 60, 62, respectively. Transistor 44 is sized so that the voltage potential from the first current electrode thereof to supply voltage $V_{SS}$ approximates the output voltage at node 54. The device size of transistor 40 is then made proportional to the size of transistor 48 and the device size of transistor 42 is made proportional to the size of transistor 50. The current through transistors 40, 42 and 44 and transistors 48 and 50 will vary with processing variations. However, since the size of the devices are ratioed proportionately, the ratio between the currents $I_1$ and $I_2$ will not vary with process variations. Therefore, after the ratios of the sizes of transistors 32 and 34 have been determined, the differential pair 18 will remain balanced at all times and provide a very precise bias voltage to the TTL interface circuits 14 and 16. When transistors 26 and 28 are P-channel transistors, differential pair 18 will sink current $I_2$ at the output. When transistors 26 and 28 are N-channel transistors, differential pair 18 will source current $I_2$ at the output.

In the embodiment shown and described, an error in the preciseness of the biasing voltage to the TTL interface circuits 14 and 16 may be produced when any one of the multiple input voltages $V_{IN}$ suddenly changes level to cause the output voltage to switch. The error may exist at the control electrode of transistors 56, 58, 60 and 62 on node 52 because a small amount of parasitic capacitance exists between the input voltage terminals of circuits 16 and 18 and node 52. An associated parasitic voltage may be charged coupled into the voltage at node 52 when a change in voltage potential occurs at the input of any of the TTL interface circuits such as 14 and 16. Therefore, transistor 64 is coupled between node 52 and supply $V_{SS}$. In the preferred form, transistor 64 is configured as an MOS capacitor and functions to bypass any AC parasitics which may be generated to supply voltage $V_{SS}$. Therefore, a precise stable single stage operational amplifier voltage source which is substantially insensitive to process and voltage variations has been provided.

While the invention has been described in the context of a preferred embodiment, it will be apparent to those skilled in the art that the present invention may be modified in numerous ways and may assume many embodiments other than that specifically set out and described above. Accordingly, it is intended by the appended claims to cover all modifications of the invention which fall within the true spirit and scope of the invention.

I claim:

1. A single stage operational amplifier voltage reference for providing a selected output current at a predetermined output voltage via an output terminal, the voltage reference comprising:
    first voltage biasing means for providing a bias voltage substantially equal to said predetermined output voltage;
    a constant current source for providing a bias current substantially equal to said selected output current;
    a first transistor of a first conductivity type having a first current electrode coupled to said constant current source to conduct a portion of said bias current, a second current electrode, and a control electrode coupled to the bias voltage provided by said first voltage biasing means;
    a second transistor of said first conductivity type having a first current electrode coupled to said constant current source to conduct a portion of said bias current, a second current electrode coupled to said output terminal, and a control electrode coupled to said output terminal; and
    a current mirror for receiving the portion of the bias current conducted by said first transistor, and providing said output current via said output terminal equal to a predetermined multiple of said received portion of the bias current.

2. The single stage operational amplifier voltage reference of claim 1 wherein said constant current source further comprises:
    a third transistor of said first conductivity type having a first current electrode coupled to a first supply voltage, a second current electrode coupled to the first current electrodes of said first and second transistors, and a control electrode; and
    second voltage biasing means coupled to the control electrode of said third transistor for controlling the amount of said bias current.

3. The single stage operational amplifier voltage reference of claim 2 wherein said second voltage biasing means comprise:
    a fourth transistor of said first conductivity type having a first current electrode coupled to said first supply voltage, and both a second current electrode and a control electrode coupled to the control electrode of said third transistor;
    a fifth transistor of a second conductivity type having both a first current electrode and a control electrode coupled to both the control electrode of said third transistor and the second current and control electrodes of said fourth transistor, and a second current electrode; and
    a sixth transistor of said second conductivity type having both a first current electrode and a control electrode coupled to the second current electrode of said fifth transistor, and a second current electrode coupled to a second supply voltage.

4. The single stage operational amplifier voltage reference of claim 1 wherein said current mirror further comprises:
    a seventh transistor of said second conductivity type having a first current electrode and a control electrode coupled together and to the second current electrode of said first transistor, and a second current electrode coupled to said second supply voltage; and
    an eighth transistor of said second conductivity type having a first current electrode coupled to said output terminal, a control electrode coupled to both the control and first current electrodes of said seventh transistor and the second current electrode of said first transistor, and a second current electrode coupled to said second supply voltage.

5. The single stage operational amplifier voltage reference of claim 1 wherein said first voltage biasing means further comprise:
    a first resistor having a first terminal coupled to said first supply voltage, and a second terminal coupled to the control electrode of said first transistor; and
    a second resistor having a first terminal coupled to both the second terminal of said first resistor and the control electrode of said first transistor, and a second terminal coupled to said second supply voltage.

6. An MOS voltage reference for providing a predetermined output voltage, comprising:
    an amplifier having first and second inputs and an output, the first input being coupled to a first bias voltage and the second input being coupled to said output; and
    a current source for providing a predetermined current to said amplifier, said current source having a first transistor coupled to the amplifier and having a control electrode, and second and third transistors coupled in series, for providing a second bias voltage to the control electrode of the first transistor.

7. The MOS voltage reference of claim 6 wherein said amplifier further comprises:
    a fourth transistor having a P-channel conductivity, a current electrode coupled to said current source to conduct a portion of said predetermined current, and a control electrode coupled to said first bias voltage; and a fifth transistor having a P-channel conductivity, a first current electrode coupled to said current source to conduct a portion of said predetermined current, and both a control electrode and second current electrode coupled to said output so the amplifier functions as a current sink.

8. An operational amplifier voltage reference for providing a predetermined output current at a predetermined output reference voltage, comprising:

an amplifier having first and second inputs and an output for providing the reference voltage, the first input being coupled to a first bias voltage and the second input being coupled to said output;

a current source for providing a predetermined source current to said amplifier, said current source having a first transistor coupled to the amplifier and having a control electrode, and second, third and fourth transistors connected in series between first and second supply voltage terminals, for providing a second bias voltage to the control electrode of the first transistor, wherein the size of the fourth transistor is made so that the voltage potential across the fourth transistor is substantially equal to the voltage at the output of the amplifier;

an output load voltage divider having fifth and sixth transistors, the fifth transistor having a first current electrode connected to the first supply voltage terminal, and both a control electrode and a second current electrode connected together at a common node for providing a bias voltage proportional to the reference voltage, and the sixth transistor having a first current electrode connected to the output of the amplifier, and both a control electrode and a second current electrode connected together at the common node; and a plurality of interface circuits coupled to the common node, each of which provides an interface output voltage having a first logic level in response to a predetermined input voltage having a value greater than the bias voltage and having a second logic level in response to the predetermined input voltage having a value less than the bias voltage;

wherein the output reference voltage is made substantially insensitive to process variations by ratioing the sizes of the second and third transistors to the sizes of the fifth and sixth transistors in a predetermined ratio.

9. The operational amplifier voltage reference of claim 8 wherein the first, second and fifth transistors are of a first conductivity type and the third, fourth and sixth transistors are of a second conductivity type.

10. The operational amplifier voltage reference of claim 8 wherein each of the plurality of interface circuits is a TTL interface circuit comprising two series connected transistors of opposite conductivity having the control electrodes thereof connected together and coupled to the common node.

11. The operational amplifier voltage reference of claim 8 further comprising:

an MOS capacitor connected between the common node and the second supply voltage.

* * * * *